United States Patent
Stephens et al.

(10) Patent No.: US 8,444,766 B2
(45) Date of Patent: May 21, 2013

(54) SYSTEM AND METHOD FOR RECYCLING A GAS USED TO DEPOSIT A SEMICONDUCTOR LAYER

(75) Inventors: Jason Michael Stephens, San Francisco, CA (US); Bradley Owen Stimson, Monte Sereno, CA (US); Guleid Nur Abdi Hussen, San Francisco, CA (US)

(73) Assignee: ThinSilicon Corporation, Mountain View, CA (US)

( * ) Notice: Subject to any disclaimer, the term of this patent is extended or adjusted under 35 U.S.C. 154(b) by 658 days.

(21) Appl. No.: 12/635,509

(22) Filed: Dec. 10, 2009

(65) Prior Publication Data

US 2010/0144066 A1 Jun. 10, 2010

Related U.S. Application Data

(60) Provisional application No. 61/121,434, filed on Dec. 10, 2008.

(51) Int. Cl.
 *C23C 16/00* (2006.01)
 *C23F 1/00* (2006.01)
 *H01L 21/306* (2006.01)

(52) U.S. Cl.
 USPC .................................... 118/715; 156/345.29

(58) Field of Classification Search
 USPC .................................... 118/715; 156/345.29
 See application file for complete search history.

(56) References Cited

U.S. PATENT DOCUMENTS

| | | | |
|---|---|---|---|
| 4,062,990 A * | 12/1977 | Coch | 427/242 |
| 4,125,643 A | 11/1978 | Reuschel et al. | |
| 5,958,138 A * | 9/1999 | Tomita et al. | 118/715 |
| 6,197,698 B1 | 3/2001 | Huang | |
| 6,277,173 B1 * | 8/2001 | Sadakata et al. | 95/12 |
| 6,328,801 B1 | 12/2001 | Gary et al. | |
| 6,376,383 B2 | 4/2002 | Mitsuiki | |
| 6,737,361 B2 | 5/2004 | Yoo | |
| 6,818,533 B2 | 11/2004 | Chen | |

(Continued)

FOREIGN PATENT DOCUMENTS

| | | |
|---|---|---|
| EP | 0 215 968 A1 | 4/1987 |
| JP | 59 064516 A | 4/1984 |
| JP | 2002-177766 | 6/2002 |
| WO | WO 2008/032108 | 3/2008 |

OTHER PUBLICATIONS

ISR for PCT/US2009/067559 dated Aug. 13, 2010.

*Primary Examiner* — Keath Chen (74) *Attorney, Agent, or Firm* — Christopher R. Carroll; The Small Patent Law Group LLC (57) ABSTRACT

A system for recycling includes a processing chamber, a reclamation reservoir and a mixing reservoir. The processing chamber is configured to receive a deposition gas deposited onto a semiconductor layer. The processing chamber has an exhaust to discharge an unused portion of the deposition gas as an effluent gas. The reclamation reservoir is in fluid communication with the processing chamber. The reclamation reservoir is configured to receive and store the effluent gas from the processing chamber. The mixing reservoir is in fluid communication with the reclamation reservoir and the processing chamber. The mixing reservoir is configured to mix the effluent gas with a virgin gas to form a recycled deposition gas. The mixing reservoir supplies the recycled deposition gas to the processing chamber to deposit an additional portion of the semiconductor layer.

18 Claims, 4 Drawing Sheets

U.S. PATENT DOCUMENTS 7,845,308 B1 * 12/2010 Corneille et al. .............. 118/667
2006/0130649 A1 * 6/2006 Jain et al. ........................... 95/82
2006/0196411 A1 * 9/2006 Suzuki et al. .................... 117/89
2009/0017206 A1 * 1/2009 Clark et al. ................ 427/248.1

* cited by examiner

SYSTEM AND METHOD FOR RECYCLING A GAS USED TO DEPOSIT A SEMICONDUCTOR LAYER

CROSS-REFERENCE TO RELATED APPLICATIONS

This application is related to and claims priority benefit to U.S. Provisional Patent Application No. 61/121,434, entitled "System and Method for Recycling a Gas Used to Deposit A Semiconductor Layer," and filed Dec. 10, 2008 (the "'434 Application"). The entire disclosure of the '434 Application is hereby incorporated by reference in its entirety.

BACKGROUND OF THE INVENTION

The subject matter herein generally relates to recycling systems and methods and, more particularly, to systems and methods for recycling one or more gases.

Some of the known semiconductor processing systems deposit semiconductor layers using chemical vapor deposition ("CVD") or plasma enhanced chemical vapor deposition ("PECVD"). These systems flow a deposition gas through a processing chamber to deposit or otherwise grow the semiconductor layers. The deposition gas includes one or more chemical species for depositing the semiconductor layer. For example, known systems use silane ($SiH_4$) and hydrogen ($H_2$) gases to deposit semiconductor layers.

A significant portion of the deposition gases used in these systems goes unused. For example, in known systems that utilize silane to grow semiconductor layers, approximately 5 to 10% of the silane is consumed and used to deposit the semiconductor layer while the remaining 90 to 95% of the silane is exhausted as waste gas. This waste gas typically is abated by burning or otherwise disposing of the silane.

Given the relatively expensive cost of gases used to deposit semiconductor films, a need exists to reduce the amount of gases that are wasted during the deposition of semiconductor layers.

BRIEF DESCRIPTION OF THE INVENTION

In one embodiment, a system for recycling includes a processing chamber, a reclamation reservoir and a mixing reservoir. The processing chamber is configured to receive a deposition gas deposited onto a semiconductor layer. The processing chamber has an exhaust to discharge an unused portion of the deposition gas as an effluent gas. The reclamation reservoir is in fluid communication with the processing chamber. The reclamation reservoir is configured to receive and store the effluent gas from the processing chamber. The mixing reservoir is in fluid communication with the reclamation reservoir and the processing chamber. The mixing reservoir is configured to mix the effluent gas with a virgin gas to form a recycled deposition gas. The mixing reservoir may supply the recycled deposition gas to the processing chamber to deposit an additional portion of the semiconductor layer.

In another embodiment, a method for recycling at least a portion of a deposition gas used to deposit a semiconductor layer includes exhausting an effluent gas from a processing chamber in which the semiconductor layer is deposited. The effluent gas includes an unused portion of the deposition gas. The method also includes determining a contaminant concentration of the effluent gas and communicating the effluent gas to a mixing reservoir when the contaminant concentration is less than a maximum contaminant concentration. The method further includes mixing the effluent gas with a virgin gas in the mixing reservoir to form a recycled deposition gas and communicating the recycled deposition gas to the processing chamber to deposit an additional portion of the semiconductor layer with the recycled deposition gas.

In another embodiment, a system for recycling gas used to deposit a semiconductor layer in a processing chamber includes a reclamation reservoir, a gas composition analyzer and a mixing reservoir. The reclamation reservoir is configured to receive effluent gas exhausted from the processing chamber and to store the effluent gas exhausted from the processing chamber during deposition of the semiconductor layer. The gas composition analyzer is configured to determine at least one of a composition and a purity of the effluent gas in the reclamation reservoir. The mixing reservoir is configured to receive the effluent gas from the reclamation reservoir when at least one of the composition and the purity of the effluent gas exceeds a minimum threshold. The effluent gas is mixed with a virgin gas in the mixing reservoir to create a recycled deposition gas. The recycled deposition gas is utilized to deposit an additional portion of the semiconductor layer.

DETAILED DESCRIPTION OF THE INVENTION

The foregoing summary, as well as the following detailed description of certain embodiments of the present invention, will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

It should be noted that although one or more embodiments may be described in connection with a system for recycling silane gas used in a silicon layer deposition process, the embodiments described herein are not limited to recycling silane gas or to a silicon layer deposition process. In particular, one or more embodiments may be implemented in connection with different types of fluid recycling systems, including, for example, recycling systems for other gases used in other semiconductor processes. Moreover, while one or more embodiments may be described as being implemented using one or more computer devices or systems, the embodiments described herein are not limited to computer-based systems and methods. In particular, one or more embodiments may be implemented in connection with non-computer based devices and methods.

Figure 1:
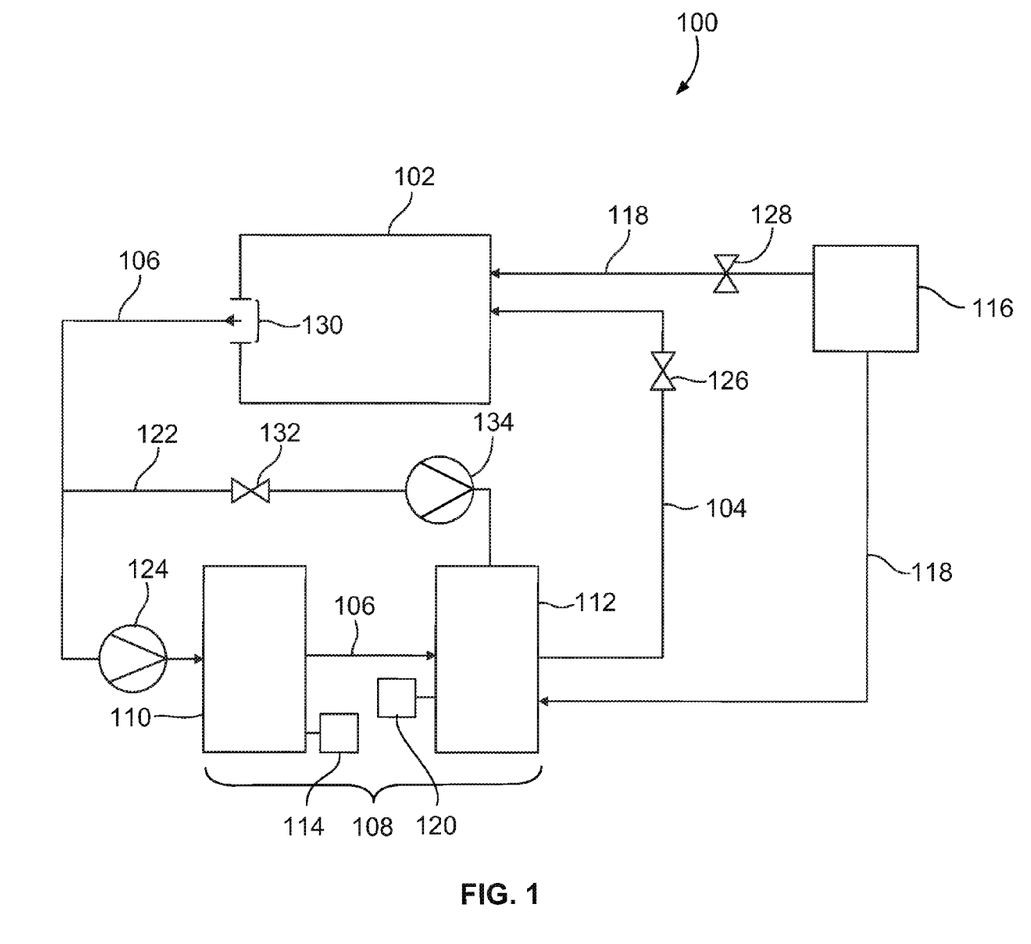
FIG. 1 is a schematic view of a gas recycling system according to one embodiment.

FIG. 1 is a schematic view of a gas recycling system 100 according to one embodiment. The gas recycling system 100 recycles chemical species that are left over from depositing a semiconductor layer for use in depositing additional semiconductor layers. For example, silane is a chemical species used in the growth of semiconductor layers such as silicon. Silane is used to deposit both doped and intrinsic silicon layers. In one embodiment, the gas recycling system 100 recycles at least some of the silane that is utilized to deposit a layer of silicon for use in depositing another silicon layer. The silicon may be intrinsic silicon or n- or p-type silicon.

The gas recycling system 100 includes a processing chamber 102 in which the semiconductor layer (not shown) is grown or otherwise deposited. For example, the processing chamber 102 may include a vacuum deposition chamber that deposits an intrinsic silicon layer through chemical vapor deposition ("CVD") or plasma enhanced CVD ("PECVD"). The processing chamber 102 receives one or more processing or deposition gases as a recycled deposition gas 104. The deposition gases may include, for example, a hydrogen carrier gas ($H_2$) and silane that is carried by the carrier gas. As described in more detail below, the deposition gases received as the recycled deposition gas 104 include partially recycled deposition gases in one embodiment.

Effluent gas 106 is exhausted from the gas recycling system 100 through an exhaust 130. The effluent gas 106 includes at least some of the processing or deposition gases and/or one or more chemical species carried by the gases. For example, the effluent gas 106 may include some hydrogen carrier gas and silane that is not consumed during the deposition of the semiconductor layer in the processing chamber 102. The effluent gas 106 may include a plurality of gases and/or chemical species that is exhausted from the processing chamber 102. In the illustrated embodiment, at least a portion of the deposition gases and the chemical species carried by the gases that is not consumed during deposition of the semiconductor layer is exhausted from the processing chamber 102 as the effluent gas 106.

A pump 124 is provided between the processing chamber 102 and a plurality of reservoirs 108. The pump 124 includes a pump that moves the effluent gas 106 toward the plurality of reservoirs 108. In one embodiment, the pump 124 increases the pressure in the conduit(s) or line(s) that provides a fluid flow path between the processing chamber 102 and the plurality of reservoirs 108. Each of the reservoirs 108 includes a storage container that is configured to receive and store the effluent gas. For example, each of the reservoirs 108 may include a high pressure vessel or gas cylinder.

The pump 124 may increase the pressure in the line between the pump 124 and the reservoirs 108 from a sub-atmospheric pressure upstream from the pump 124 to an above atmospheric pressure downstream from the pump 124. In one embodiment, atmospheric pressure is approximately 100 kiloPascals. The term "downstream" indicates that one component is located farther along a path that a gas flows in the gas recycling system 100 than another component. Conversely, the term "upstream" indicates that one component is located before another component in the path that the gas flows in the gas recycling system 100. For example, as the effluent gas flows from the processing chamber 102 to reservoirs 108 in the illustrated embodiment, the reservoirs 108 are downstream from the pump 124 and the processing chamber 102 is upstream from the pump 124. The pump 124 pressurizes the effluent gas 106 in one or more of the reservoirs 108 in one embodiment. For example, each of the reservoirs 108 may include a pressurized tank configured to hold pressurized effluent gas 106 that is pumped in by the pump 124. Pressurizing the effluent gas 106 in one or more of the reservoirs 108 can reduce the total space and/or volume used by the system 100. In one embodiment, a plurality of pumps 124 is provided. For example, each reservoir 108 may be associated with a pump 124 that is upstream from the reservoir 108 but downstream from another reservoir 108. By way of example only, a pump 124 may be provided between each of the reservoirs 108 and between the plurality of reservoirs 108 and the processing chamber 102.

The reservoirs 108 are fluidly coupled with, and in fluid communication with one another, the processing chamber 102 and a gas source reservoir 116. Each of the plurality of reservoirs 108 is a storage container that is configured to receive and store the effluent gas 106. For example, each of the reservoirs 108 may include a high pressure vessel or gas cylinder. The plurality of reservoirs 108 includes at least one reclamation reservoir 110 and at least one mixing reservoir 112. Additional reclamation reservoirs 110 and/or mixing reservoirs 112 may be included in the plurality of reservoirs 108.

The reclamation reservoir 110 receives at least a portion of the effluent gas 106. In one embodiment, the reclamation reservoir 110 receives and stores the effluent gas 106 at an above-atmospheric pressure. The gas source reservoir 116 is a vessel or chamber that stores and supplies a gas and/or a chemical species used in the deposition of the semiconductor layer in the processing chamber 102. For example, the gas source reservoir 116 may be a source of silane that is used in the processing chamber 102 and is sought to be recycled by the system 100.

In one embodiment, the effluent gas 106 is mixed with a virgin gas 118 from the gas source reservoir 116 in the mixing reservoir 112 to create a mixture of the effluent gas 104 and the virgin gas 118. The virgin gas 118 includes a gas that is used to deposit the semiconductor layer in the processing chamber 102 and that has not previously passed through the processing chamber 102. For example, virgin gas 118 may be fed into the processing chamber 102 to deposit a semiconductor layer, with the unused portion of the virgin gas 118 being drawn out of the processing chamber as the effluent gas 106. In one manner, the virgin gas 118 is the pure gas prior to depositing a semiconductor layer while the effluent gas 106 is the gas leftover from depositing the semiconductor layer.

The mixture of effluent and virgin gases 106, 118 is the recycled deposition gas 104 that is communicated to the processing chamber 102 from the mixing reservoir 112 for use in depositing another semiconductor layer. For example, the effluent gas 106 communicated from the reclamation reservoir 110 may have an insufficient concentration of a chemical species used in the deposition of a semiconductor layer. The virgin gas 118 added to the effluent gas 106 in the mixing reservoir 112 may include a relatively higher concentration of this chemical species. The mixture of the effluent gas 106 and the virgin gas 118 in the mixing reservoir 112 increases the concentration of the chemical species to a minimum level required for depositing the semiconductor layer. For example, the virgin gas 118 may be added to the mixing reservoir 112 until the concentration of a chemical species such as silane in the effluent gas 106 in the mixing reservoir 112 is at least as great as a predetermined threshold.

The recycled deposition gas 104 is communicated from the mixing reservoir 112 to the processing chamber 102. The processing chamber 102 receives the recycled deposition gas 104 and utilizes the recycled deposition gas 104 to deposit another semiconductor layer. For example, the system 100 may collect the effluent gas 106 from the deposition of a first semiconductor layer, recycle the effluent gas 106, and then use the recycled deposition gas 104 that is reconstituted from the effluent gas 106 to deposit a second semiconductor layer.

Alternatively, the system 100 may recycle the effluent gas 106 from the deposition of a semiconductor layer in continued deposition of the same semiconductor layer. For example, as the semiconductor layer is being deposited, the effluent gas 106 may be concurrently recycled and reconstituted by the system 100 and reintroduced into the processing chamber 102 for continued deposition of the semiconductor layer.

In one embodiment, a gas composition analyzer 114, 120 is operatively connected to one or more of the reservoirs 108. Each of the gas composition analyzers 114, 120 determines or measures the concentration of one or more contaminants (to determine a purity of the effluent gas) and/or chemical species (to determine a composition of the effluent gas) in the effluent gas. For example, the gas composition analyzer 114 may include a residual gas analyzer that measures a contaminant and/or chemical species concentration in the effluent gas 106 in the reclamation reservoir 110 and the gas composition analyzer 120 may include a residual gas analyzer that measures a contaminant and/or chemical species in the effluent gas 106 and/or recycled deposition gas 104 in the mixing reservoir 112.

In one embodiment, the reclamation reservoir 110 receives and stores the effluent gas 106 during the deposition of a semiconductor layer, but does not communicate the effluent gas 106 to the mixing reservoir 112 until deposition of the semiconductor layer is substantially complete. For example, the reclamation reservoir 110 may not communicate the effluent gas 106 to the mixing reservoir 112 until the semiconductor layer has been completely deposited and/or the reclamation reservoir 110 is full. Once the effluent gas is stored and collected in the mixing reservoir 112, the composition and/or purity of the effluent gas may be measured by the gas composition analyzer 114, 120 at any time after the deposition of the semiconductor film is complete.

The effluent gas 106 in the reclamation reservoir 110 may be contaminated. An example of a contaminant may be a chemical species that would interfere or damage the deposition or growth of the semiconductor layer in the processing chamber 102 if the contaminant were permitted to reach the processing chamber 102. Another example of a contaminant may be an undesired type of dopant. For example, if the processing chamber 102 previously was utilized to grow a p-type silicon layer but is now to be used to grow an intrinsic or n-type silicon layer, then the presence of the chemical species used to generate the p-type silicon (such as boron, for example) in the processing chamber 102 and in the effluent gas 106 in any of the reservoirs 108 may be a contaminant. In order to avoid contamination of the processing chamber 102, the reclamation reservoir 110 may be removed from being in fluid communication with the mixing reservoir 112 and the processing chamber 102. For example, a bypass flow path 122 may extend around the reclamation reservoir 110 so as to fluidly couple the processing chamber 102 and the mixing reservoir 112 while preventing the flow of the effluent gas 106 into or out of the reclamation reservoir 110. One or more valves 132 may divert the effluent gas 106 to flow into the bypass flow path 122 rather than into the reclamation reservoir 110. The bypass flow path 122 directs the effluent gas 106 into the mixing reservoir 112 and thus avoids passing through the reclamation reservoir 110. The bypass flow path 122 may include a pump 134 to move the gas 106 along the path 122. In one embodiment, the bypass flow path 122 may be employed to divert the effluent gas 106 so as to bypass the reclamation reservoir 110 and flow into the mixing reservoir 112 when the reclamation reservoir 110 is full. For example, the reclamation reservoir 110 may be full of effluent gas 106 and may not be capable of safely storing additional effluent gas 106. The bypass flow path 122 may then be employed to avoid flowing more effluent gas 106 into the reclamation reservoir 110.

A valve 126 is provided between the mixing reservoir 112 and the processing chamber 102 and a valve 128 is provided between the gas source reservoir 116 and the processing chamber 102 in one embodiment. The valve 126 permits or prohibits flow of the recycled deposition gas 104 from the mixing reservoir 112 to the processing chamber 102. For example, in one position, the valve 126 does not permit the recycled deposition gas 104 to flow from the mixing reservoir 112 to the processing chamber 102 while, in another position, the valve 126 permits the recycled deposition gas 104 to flow from the mixing reservoir 112 to the processing chamber 102. The valve 128 permits or prohibits flow of the virgin gas 118 from the gas source reservoir 116 to the processing chamber 102. For example, in one position, the valve 128 does not permit the virgin gas 118 to flow from the gas source reservoir 116 to the processing chamber 102 while, in another position, the valve 128 permits the virgin gas 118 to flow from the gas source reservoir 116 to the processing chamber 102. In one embodiment, the valves 126, 128 prohibit the recycled deposition gas 104 from flowing from the mixing reservoir 112 to the processing chamber 102 while permitting the virgin gas 118 to flow from the gas source reservoir 116 to the processing chamber 102. For example, if the mixing reservoir 112 becomes contaminated, damaged, and the like, or the recycled deposition gas 104 in the mixing reservoir 112 is not to be used in the processing chamber 112, the valve 126 can be closed while the valve 128 is opened. The virgin gas 118 may then flow into the processing chamber 102 in place of the recycled deposition gas 104. Alternatively, the valves 126, 128 alter the flow rate of the recycled deposition gas 104 and the virgin gas 118 into the processing chamber 102. For example, depending on the relative amounts of recycled deposition gas 104 and virgin gas 118 needed for depositing the semiconductor layer in the processing chamber 102, each of the valves 126, 128 may be adjusted to allow more or less of the recycled deposition gas 104 and the virgin gas 118 into the processing chamber 102.

The processing chamber 102 receives the recycled deposition gas 104 and utilizes at least some of the recycled deposition gas 104 to deposit a semiconductor layer. One or more unused portions of the recycled deposition gas 104 may be exhausted from the processing chamber 102 as the effluent gas 106. This effluent gas 106 can then be recycled for use in depositing yet another semiconductor layer. For example, the system 100 can operate in a loop-wise manner to repeatedly recycle effluent gas 106 that is not fully utilized in depositing or growing semiconductor layers in the processing chamber 102.

Figure 2:
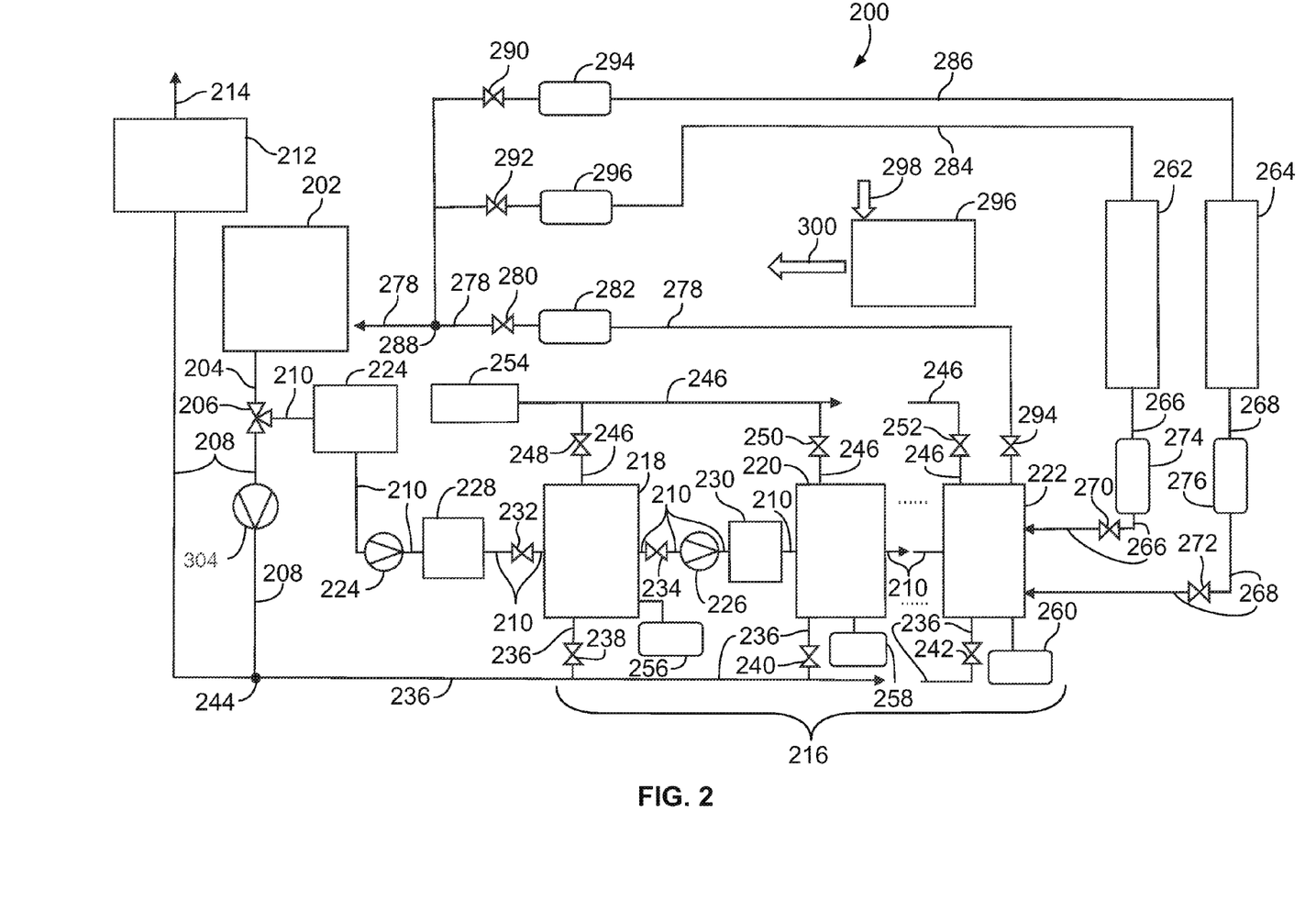
FIG. 2 is a schematic view of components and fluid flow paths in a gas processing system according to another embodiment.

FIG. 2 is a schematic view of components and fluid flow paths in a gas processing system 200 according to another embodiment. The gas processing system 200 recycles at least a portion of the unused gas used to deposit or grow a semiconductor layer in a manner similar to the gas processing system 100 shown in FIG. 1. The gas recycling system 200 includes a processing chamber 202 that is similar to the processing chamber 102 (shown in FIG. 1). For example, the processing chamber 202 may include a vacuum deposition chamber that deposits an intrinsic silicon layer through CVD or PECVD. The processing chamber 202 receives one or more of virgin deposition gases and a recycled deposition gas. The processing chamber 202 utilizes the virgin and/or recycled deposition gases to deposit the semiconductor layer. For example, the processing chamber 202 may receive one or more of a virgin or pure silane gas, a virgin or pure hydrogen gas, a recycled silane gas, and a recycled hydrogen gas to deposit an intrinsic silicon layer.

Effluent gas is exhausted from the processing chamber 202 along an effluent flow path 204. The effluent gas includes one or more gases and chemical species that is left unused during a semiconductor layer deposition process and that is to be at least partially recycled by the system 200. For example, the effluent gas may be similar to the effluent gas 106 (shown in FIG. 1). The effluent flow path 204 includes a fluid passageway through which the effluent gas is able to flow. For example, the effluent flow path 204 may include a conduit or other channel that includes a material capable of handling and directing the effluent gas.

An abatement valve 206 is provided downstream from the processing chamber 202 in the illustrated embodiment. The abatement valve 206 includes a valve capable of directing the flow of the effluent gas along at least one of an abatement flow path 208 and a reservoir flow path 210. The reservoir flow path 210 includes a fluid passageway through which the effluent gas is able to flow. For example, the reservoir flow path 210 may include a conduit or other channel that includes a material capable of handling and directing the effluent gas. In one embodiment, the abatement valve 206 includes a three-way valve. In a first position, the abatement valve 206 permits the effluent gas to flow along the abatement flow path 208 and prevents substantially all of the effluent gas from flowing along the reservoir flow path 210. In a second position, the abatement valve 206 permits the effluent gas to flow along the reservoir flow path 210 and prevents substantially all of the effluent gas from flowing along the abatement flow path 208. Alternatively, the abatement valve 206 permits a portion of the effluent gas to flow along the abatement flow path 208 and another portion of the effluent gas to flow along the reservoir flow path 210. For example, the abatement valve 206 may regulate the flow of the effluent gas along the abatement and reservoir flow paths 208, 210 by increasing and/or restricting the rate of flow, or flow rate, of the effluent gas along one or more of the abatement and reservoir flow paths 208, 210.

The abatement flow path 208 extends between the abatement valve 206 and an abatement device 212. The abatement device 212 includes a device or system that removes, converts or destroys one or more chemical species in the effluent gas prior to exhausting the effluent gas into the surrounding atmosphere as exhaust 214. For example, the abatement device 212 may be embodied in one or more of a plasma abatement device, an incineration device, a thermal decomposition device, and the like. An abatement pump 304 is provided between the abatement valve 206 and the abatement device 212 in the illustrated embodiment. The abatement pump 304 includes a pump capable of pumping the effluent gas through the abatement flow path 208 and to the abatement device 212. The effluent gas that flows along the abatement flow path 208 into the abatement device 212 is disposed of or otherwise converted into the exhaust 214 and dispersed into the surrounding atmosphere or a peripheral container, chamber, volume, and the like.

The reservoir flow path 210 extends between the abatement valve 206 and a plurality of reservoirs 216. In the illustrated embodiment, the reservoirs 216 include a plurality of reclamation reservoirs 218, 220 and a mixing reservoir 222. Alternatively, the system 200 may include a different number of the reclamation reservoirs 218, 220 and the mixing reservoir 222. The reservoirs 216 may be similar to the reservoirs 108 shown in FIG. 1. For example, each of the reclamation reservoirs 218, 220 may be similar to the reclamation reservoir 110 (shown in FIG. 1) and the mixing reservoir 222 may be similar to the mixing reservoir 112 (shown in FIG. 1). The reclamation reservoirs 218, 220 receive at least a portion of the effluent gas from the reservoir flow path 210. One or more of the reclamation reservoirs 218, 220 communicates the effluent gas to the mixing reservoir 222. In one embodiment, the mixing reservoir 222 mixes the effluent gas with virgin gas to create the recycled deposition gas. The recycled deposition gas is then communicated from the mixing reservoir 222 into the processing chamber 202 so the processing chamber 202 can use at least a portion of the recycled deposition gas to deposit another semiconductor layer.

In the illustrated embodiment, a filter 224 is provided between the abatement pump 206 and the first reclamation reservoir 218. The filter 224 is a particle filter in one example. The filter 224 may include a device that removes one or more particles from the effluent gas as the effluent gas flows through the filter 224. By way of a nonlimiting example, the filter 224 may include a mechanical mesh filter.

Each of the reservoirs 216 is interconnected and in fluid communication with one another and with the processing chamber 202 in the illustrated embodiment. The reservoirs 216 are interconnected so that the effluent gas can flow in a loop that includes the processing chamber 202, the reservoir flow path 210, and the reservoirs 216. In one embodiment, the reclamation reservoirs 218, 220 are interchangeable with one another. In another embodiment, the flow of the effluent gas may bypass one or more of the reclamation reservoirs 218, 220 and flow to the mixing reservoir 222.

In the illustrated embodiment, the reclamation reservoirs 218, 220 are provided in series. Alternatively, the reclamation reservoirs 218, 220 may be provided in parallel with one another. For example, the reservoir flow path 210 may split into two reservoir flow paths 210 that each flow into a parallel reclamation reservoir 218, 220 and then into the mixing reservoir 222. Each parallel reservoir flow path 210 may include a series of reclamation reservoirs 218, 220 fluidly coupled with one another.

In one embodiment, the reclamation reservoirs 218, 220 may be individually removed from the reservoir flow path 210 while the effluent gas continues to flow into one or more remaining ones of the reservoirs 216. For example, the first reclamation reservoir 218 may be disconnected and removed from the reservoir flow path 210. The reservoir flow path 210 may continue to fluidly connect the remaining reservoirs 216 after the first reclamation reservoir 218 is removed. For example, the effluent gas can continue to be collected in the reservoirs 216 and recycled even after one of the reclamation reservoirs 216, 218 is removed from the system 200. A reclamation reservoir 216, 218 may be removed when the reclamation reservoir 216, 218 becomes full of effluent gas or contaminated, for example.

As shown in FIG. 2, each of the reclamation reservoirs 218, 220 is associated with, and downstream from, a pump 224, 226, a filter 228, 230 and a valve 232, 234. The pumps 224, 226 include pumps that move the effluent gas through and along the reservoir flow path 210 to and between the reservoirs 216. The filters 228, 230 include devices that remove one or more contaminants from the effluent gas as the effluent gas flows through the reservoir flow path 210. For example, the filters 228, 230 may mechanically and/or chemically filter one or more contaminants from the effluent gas. The placement of the filters 228, 230 between the reservoirs 216 assists in filtering out contaminants that are introduced into the effluent gas by reservoirs 216 located upstream of the filters 228, 230 in the reservoir flow path 210. In one embodiment, the filters 228, 230 include one or more mechanical mesh filters that remove particulates from the effluent gas. Each of the valves 232, 234 include one or more valves that permit or restrict the flow of the effluent gas through the reservoir flow path 210. For example, the valves 232, 234 may include check valves that permit or prohibit the flow of the effluent gas through the reservoir flow path 210. In one embodiment, the valves 232, 234 alter or otherwise change the rate of flow of the effluent gas through the reservoir flow path 210 while permitting at least some of the effluent gas to pass through the respective valve 232, 234.

In the illustrated embodiment, the pumps 224, 226, filters 228, 230 and valves 232, 234 are positioned along the reservoir flow path 210 such that each reclamation reservoir 218, 220 is downstream from a corresponding one of each of the pumps 224, 226, filters 228, 230 and valves 232, 234. For example, with respect to the first reclamation reservoir 218, the filter 228 is disposed between the pump 224 and the valve 232 so that the first reclamation reservoir 218 is downstream from the valve 232, the valve 232 is downstream from the filter 228, and the filter 228 is downstream from the pump 224 along the reservoir flow path 210. Other arrangements of the storage reservoirs 218, 220, pumps 224, 226, filters 228, 230 and valves 232, 234 are possible. For example, with respect to the second reclamation reservoir 220, the second storage reservoir 220 is downstream from the filter 230, the filter 230 is downstream from the pump 224, and the pump 224 is downstream from the valve 234. Although not shown in FIG. 2, a valve similar to one of the valves 232, 234 may be provided upstream from the mixing reservoir 222 in a manner similar to the valves 232, 234 and the reclamation reservoirs 218, 220. A filter similar to one of the filters 228, 230 may be provided upstream from the mixing reservoir 222 in a manner similar to the filters 228, 230 and the reclamation reservoirs 218, 220. A pump similar to one of the pumps 224, 226 may be provided upstream from the mixing reservoir 222 in a manner similar to the pumps 224, 226 and the reclamation reservoirs 218, 220.

In one embodiment, the reclamation reservoirs 218, 220 receive effluent gas at an above-atmospheric pressure and store the effluent gas at an above-atmospheric pressure until the reclamation reservoir 218, 220 is substantially full of effluent gas. For example, the reclamation reservoirs 218, 220 may continue to store effluent gas until the pressure of the effluent gas in the reclamation reservoir 218 and/or 220 exceeds a predetermined pressure limit. The valve (such as the valve 234) that is downstream from the substantially full reclamation reservoir 218, 220 may then open to permit the effluent gas to flow into the next reclamation reservoir 218, 220 in the series of reclamation reservoirs 218, 220.

Each of the reservoirs 216 is in fluid communication with a return flow path 236. For example, each of the reservoirs 216 is fluidly coupled with the return flow path 236 through at least one valve 238, 240, 242. The return flow path 236 provides a fluid communication path between each of the reservoirs 216 and the abatement device 212. For example, the effluent gas in one or more of the reservoirs 216 can flow from the respective reservoir 216, through the corresponding opened one of the valves 238, 240, 242 and into the return flow path 236. The return flow path 236 includes a fluid passageway through which the effluent gas is able to flow. For example, the return flow path 236 may include a conduit or other channel that includes a material capable of handling and directing the effluent gas.

The valves 238, 240, 242 include one or more valves that prohibit or restrict the flow of the effluent gas from a corresponding reservoir 216 into the return flow path 236 when the valves 238, 240, 242 are in one position and permit the flow of the effluent gas from the corresponding reservoir 216 into the return flow path 236 when the valves 238, 240, 242 are in another position. For example, the valves 238, 240, 242 may include one or more check valves. The return flow path 236 is fluidly coupled with the abatement flow path 208 at an interface 244. The interface 244 represents a junction or interface through which the effluent gas may flow that is between the return and abatement flow paths 236, 208. The effluent gas can flow from the reservoirs 216 to the abatement device 212 through the return flow path 236 and the abatement flow path 208.

Each of the reservoirs 216 is in fluid communication with a purge flow path 246. For example, each of the reservoirs 216 is interconnected with the purge flow path 246 through at least one of the valves 248, 250, 252. The purge flow path 246 provides a fluid communication path between each of the reservoirs 216 and a purge gas source 254. The purge flow path 246 includes a fluid passageway through which the effluent gas is able to flow. For example, the purge flow path 246 may include a conduit or other channel that includes a material capable of handling and directing the effluent gas. The purge gas source 254 includes a source of a purge gas. For example, the purge gas source 254 can include a pressurized vessel or tank of nitrogen or other inert gas. The reservoirs 216, purge gas source 254, and abatement device 212 are in fluid communication with the return, purge and abatement flow paths 236, 246, 208 such that the reservoirs 216 may be individually purged of effluent gas. For example, the effluent gas in one or more of the reservoirs 216 may become contaminated and the reservoir 216 may need to be purged of the contaminated effluent gas. An example of a contaminant may be a chemical species that would interfere or damage the deposition or growth of the semiconductor layer in the processing chamber 202 if the contaminant were permitted to reach the processing chamber 202. Another example of a contaminant may be an undesired dopant. If the processing chamber 202 previously was utilized to grow a p-type silicon layer but is now to be used to grow an intrinsic or n-type silicon layer, then the presence of the chemical species used to generate the p-type silicon (such as boron, for example) in the processing chamber 202 and in the effluent gas in any of the reservoirs 216 may be a contaminant. The presence of the boron is flushed from any the effluent gas in the reservoirs 216 to avoid contaminating the n-type or intrinsic silicon with the boron.

By way of example, in order to purge the first reclamation reservoir 218, for example, the valve 232 may be closed to restrict the flow of additional effluent gas into the first reclamation reservoir 218. The valve 248 is opened to provide a fluid communication path between the purge gas source 254 and the first reclamation reservoir 218. The valve 238 is opened to provide a fluid communication path between the first reclamation reservoir 218 and the return flow path 236. The purge gas source 254 then flushes at least a portion of the purge flow path 246 and the first reclamation reservoir 218 with the purge gas. The purge gas flushes the contaminated effluent gas in the first reclamation reservoir 218 from the first reclamation reservoir 218 and into the abatement device 212 through the return and abatement flow paths 236, 208. Once the contaminated effluent gas is removed from the first reclamation reservoir 218, the valves 248, 238 may be closed and the valve 232 may be opened to permit additional effluent gas to flow into the first reclamation reservoir 216 from the reservoir flow path 210.

In the illustrated embodiment, each of the reservoirs 216 is operatively coupled with a gas composition analyzer 256, 258, 260. The gas composition analyzers 256, 258, 260 may be similar to the gas composition analyzers 114, 120 shown in FIG. 1. For example, each of the gas composition analyzers 256, 258, 260 may determine or measure a concentration of one or more contaminants and chemical species in the effluent gas in a corresponding one of the reservoirs 216. In one embodiment, the gas composition analyzers 256, 258, 260 are residual gas analyzers that measure the concentration of silane in the corresponding reservoirs 216.

The effluent gas in one or more of the reclamation reservoirs 218, 220 flows through the reservoir flow path 210 to the mixing reservoir 222. For example, the effluent gas may be communicated from the reclamation reservoirs 218, 220 to the mixing reservoir 222 in a manner similar to the reclamation and mixing reservoirs 110, 112 shown in FIG. 1. As described above, each of the reclamation reservoirs 218, 220 may receive and store effluent gas until the deposition of the semiconductor layer in the processing chamber 202 is substantially complete and/or the reclamation reservoir 218, 220 is substantially full of the effluent gas in one embodiment. For example, once the deposition of the semiconductor layer is complete and/or the first reclamation reservoir 218 is full of effluent gas, the effluent gas may be communicated from the first reclamation reservoir 218 to the second reclamation reservoir 220 and/or the mixing reservoir 222. In a similar manner, in one embodiment the second reclamation reservoir 220 continues to receive effluent gas until the second reclamation reservoir 220 is substantially full and/or the deposition of the semiconductor film in the processing chamber 202 is substantially complete. The effluent gas then may be communicated from the second reclamation reservoir 220 to the mixing reservoir 222.

In one embodiment, the effluent gas may not be communicated from one reclamation reservoir 218, 220 to another, and/or from the reclamation reservoir 220 to the mixing reservoir 222 until the reclamation reservoir 220 has been tested for composition and/or purity. For example, the first reclamation reservoir 218 may collect and store the effluent gas from the deposition of a first semiconductor layer in the processing chamber 202. The first reclamation reservoir 218 may only communicate the effluent gas to the second reclamation reservoir 218, 220 when the first reclamation reservoir 218 is substantially full and/or when the purity of the effluent gas in the first reclamation reservoir 218 is determined and found to be greater than a minimum purity threshold. The effluent gas may then be communicated to the second reclamation reservoir 220. The second reclamation reservoir 220 may only communicate the effluent gas to the mixing reservoir 222 when the second reclamation reservoir 220 is substantially full and/or when the purity of the effluent gas in the second reclamation reservoir 220 is determined and found to be greater than a minimum purity threshold. The effluent gas may then be communicated to the mixing reservoir 222. By storing and testing the effluent gas in one or more of a plurality of reclamation reservoirs 218, 220, the system 200 may not be required to test the purity and/or composition of the effluent gas in real time during the deposition of a semiconductor layer. Instead, the effluent gas from the deposition of a semiconductor layer may be collected in one or more reclamation reservoirs 218, 220, the concentration of contaminants and/or chemical species determined at a later point in time, and then communicated to the mixing reservoir 222. Alternatively, the effluent gas may not be communicated from one reclamation reservoir 218, 220 to another, and/or from the reclamation reservoir 220 to the mixing reservoir 222 until the deposition of the semiconductor layer in the processing chamber 202 is substantially complete.

Alternatively, the effluent gas in one or more of the reclamation reservoirs 218, 220 may be communicated to the mixing reservoir 222 as the effluent gas is received from the processing chamber 202 and/or one or more upstream reclamation reservoirs 218, 220. For example, the effluent gas may be communicated through the reclamation reservoirs 218, 220 and to the mixing reservoir 222 to be recycled concurrently with the deposition of the semiconductor layer. In one embodiment, the effluent gas is recycled in the mixing reservoir 222 (as described below) and communicated into the processing chamber 202 concurrently with the continued deposition of the semiconductor layer.

In one embodiment, the effluent gas is mixed in the mixing reservoir 222 with one or more virgin gases from one or more gas source reservoirs to create a mixture of the effluent gas and the virgin gases. For example, virgin hydrogen gas ($H_2$) and/or virgin silane gas ($SiH_4$) may be supplied to the mixing reservoir 222 and mixed with the effluent gas to create the recycled deposition gas. The effluent gas in the mixing reservoir 222 may have an insufficient concentration of a chemical species used in the deposition of a semiconductor layer. For example, the effluent gas in the mixing reservoir 222 may include an amount of silane that is too low to deposit a silicon layer in the processing chamber 202. The concentration of the chemical species in the effluent gas in the mixing reservoir 222 may be determined by the gas composition analyzer 260. Virgin, or pure, gases include a relatively higher concentration of this chemical species. For example, virgin silane gas can be added to the effluent gas in the mixing reservoir 222 to increase the concentration of silane in the effluent gas. The mixture of the effluent gas and the virgin gas in the mixing reservoir 222 increases the concentration of the chemical species to a minimum level required for depositing the semiconductor layer. For example, the virgin gas may be added to the mixing reservoir 222 until the concentration of a chemical species such as silane in the effluent gas in the mixing reservoir 222 is at least as great as a predetermined threshold. The concentration of the chemical species in the gas in the mixing reservoir 222 may be determined by the gas composition analyzer 260. The system 200 may prevent the recycled deposition gas in the mixing reservoir 222 from flowing into the processing chamber 202 until the concentration of one or more chemical species exceeds one or more predetermined thresholds.

A plurality of gas source reservoirs 262, 264 may be fluidly coupled with the mixing reservoir 222 through a plurality of virgin gas flow paths 266, 268. The gas source reservoirs 262, 264 store the same or different virgin gases. For example, the gas source reservoir 262 may store virgin, or pure, silane gas ($SiH_4$) while the gas source reservoir 264 stores virgin, or pure, hydrogen gas ($H_2$). A plurality of valves 270, 272 and mass flow controllers 274, 276 are used to control the amount of virgin gases that are mixed with the effluent gas in the mixing reservoir to create the recycled deposition gas. For example, a valve 270, 272 in each of the virgin gas flow paths 266, 268 between the gas source reservoirs 262, 264 and the mixing reservoir 222 operates to permit and prohibit the flow of virgin gases from each of the gas source reservoirs 262, 264 into the mixing reservoir 222. The mass flow controller 274, 276 in each of the virgin gas flow paths 266, 268 between the gas source reservoirs 262, 264 and the mixing reservoir 222 operates to control the flow of the virgin gas from the respective gas source reservoirs 262, 264 into the mixing reservoir 222. For example, the mass flow controller 274 may permit a greater volume of a virgin gas in the gas source reservoir 262 to flow in a given time period into the mixing reservoir 222 than the mass flow controller 276 permits to flow from the gas source reservoir 264.

The mixing reservoir 222 is fluidly coupled with the processing chamber 202 by a recycled gas flow path 278. The recycled gas flow path 278 includes a fluid passageway through which the recycled deposition gas is able to flow. For example, the recycled gas flow path 278 may include a conduit or other channel that includes a material capable of handling and directing the recycled deposition gas. At least some of the recycled deposition gas in the mixing reservoir 222 flows from the mixing reservoir 222 into the processing chamber 202. This recycled deposition gas is then used to deposit a semiconductor layer in the processing chamber 202. One or more valves 280, 294 and a mass flow controller 282 are disposed in the recycled gas flow path 278 between the mixing reservoir 222 and the processing chamber 202 to regulate the amount of recycled deposition gas that flows into the processing chamber 202. For example, one or more of the valves 280, 294 may close and open the recycled gas flow path 278 to prohibit and permit, accordingly, the flow of the recycled deposition gas from the mixing reservoir 222 into the processing chamber 202. The mass flow controller 282 may vary the rate of flow of the recycled deposition gas through the recycled gas flow path 278 and into the processing chamber 202.

In the illustrated embodiment, a plurality of source gas flow paths 284, 286 fluidly couples each of the gas source reservoirs 262, 264 with the recycled gas flow path 278. Each of the source gas flow paths 284, 286 includes a fluid passageway through which the virgin gas from a corresponding gas source reservoir 262, 264 is able to flow. For example, the source gas flow paths 284, 286 may include conduits or other channels that include a material capable of handling and directing one or more of the virgin gases. The source gas flow paths 284, 286 interface with and provide a fluid communication pathway with the recycled gas flow path 278 through an interface 288. The interface 288 represents a junction or interface between the source gas flow paths 284, 286 and the recycled gas flow path 278 through which the recycled deposition gas and one or more virgin gases from the gas source reservoirs 262, 264 may flow. The source gas flow paths 284, 286 provide for fluid communication between the gas source reservoirs 262, 264 and the processing chamber 202 via at least a portion of the recycled gas flow path 278 so that the virgin gases stored in the gas source reservoirs 262, 264 can be supplied to the processing chamber 202. In one embodiment, at least some virgin gas from the one or more of the gas source reservoirs 262, 264 is supplied to the processing chamber 202 along with the recycled deposition gas from the mixing reservoir 222 in order to deposit a semiconductor layer in the processing chamber 202. For example, the processing chamber 202 may deposit a semiconductor layer using recycled deposition gas from the mixing reservoir 222, hydrogen gas ($H_2$) from the gas source reservoir 264, and silane gas ($SiH_4$) from the gas source reservoir 262. In one embodiment, one or more of the valves 280, 294 may be closed and one or more of the valves 290, 292 may be opened to prohibit the flow of recycled deposition gas, and permit the flow of one or more virgin gases, into the processing chamber 202. For example, if the recycled deposition gas has a contaminant concentration that is too great to be used to deposit a semiconductor film, the mixing reservoir 222 may be sealed from the processing chamber 202 while the gas source reservoir 262 and/or 264 is permitted to provide virgin gas to the processing chamber 202.

In the illustrated embodiment, a valve 290, 292 and a mass flow controller 294, 296 is provided along each of the source gas flow paths 284, 286 between the gas source reservoirs 262, 264 and the processing chamber 202. One or more of the valves 290, 292 and the mass flow controllers 294, 296 regulate the amount of virgin gas that flows from a corresponding gas source reservoir 262, 264 into the processing chamber 202. For example, the valves 290, 292 may close and open the source gas flow paths 286, 284 to prohibit and permit, accordingly, the flow of virgin gases from the gas source reservoirs 264, 262 into the processing chamber 202. The mass flow controllers 290, 292 may vary the rate of flow of the virgin gases through the source gas flow paths 286, 284 and into the processing chamber 202.

As described above, the processing chamber 202 receives one or more of the recycled deposition gas and virgin gases to deposit or grow a semiconductor layer. One or more unused portions of the recycled deposition gas and the virgin gases is output from the processing chamber 202 into the effluent flow path 204 as the effluent gas. This effluent gas may then be recycled and at least a portion of the effluent gas used to create a recycled deposition gas. In doing so, the system 200 reduces the amount of gases and chemical species that are wasted during known semiconductor layer growth processes.

Figure 3:
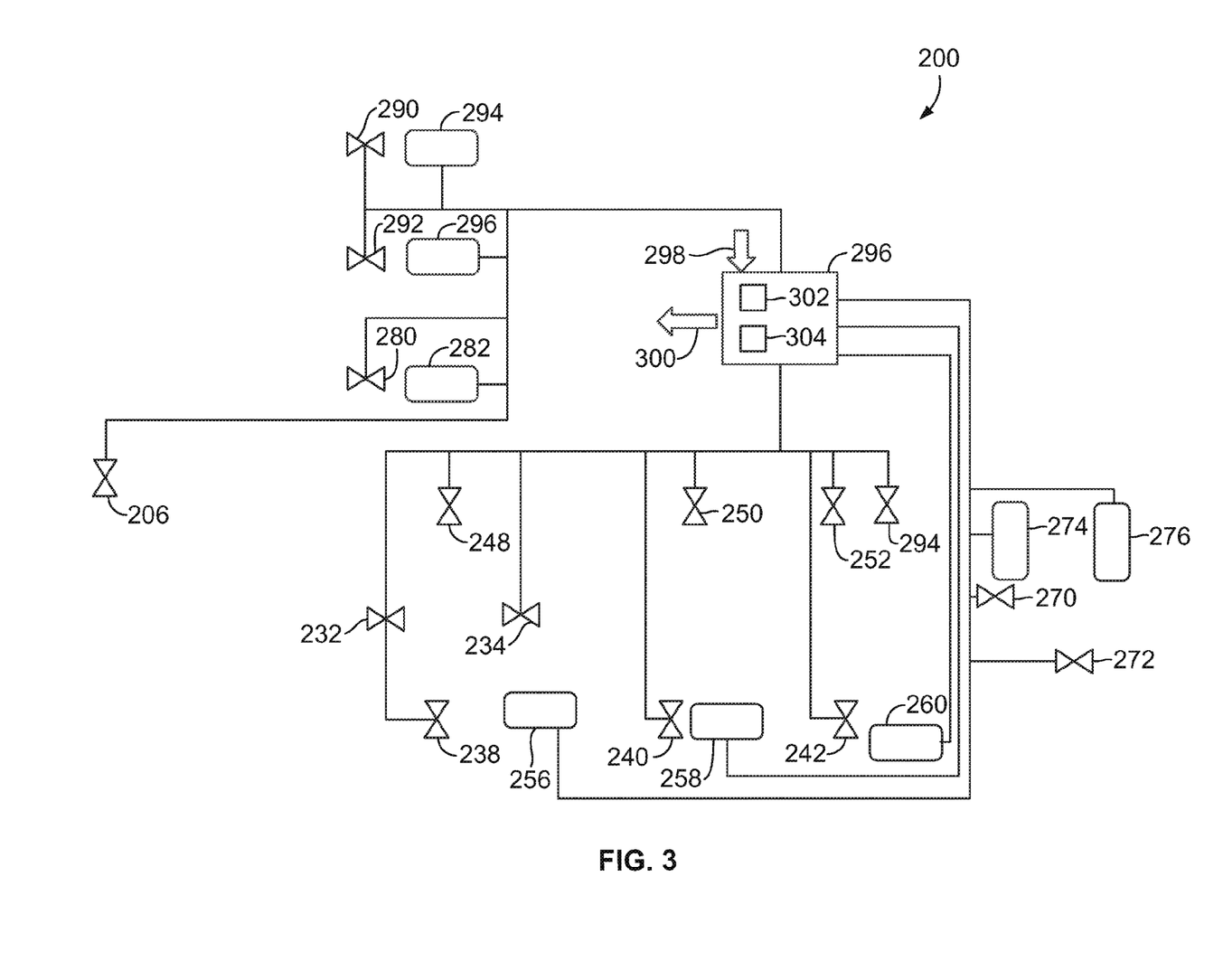
FIG. 3 is a schematic view of components and communication paths in the gas processing system shown in FIG. 2.

In one embodiment, the system 200 includes a controller 296 that is employed to control one or more of the valves 206, 232, 238, 248, 234, 240, 250, 252, 242, 270, 272, 290, 292, 294 and the mass flow controllers 274, 276, 282, 294, 296. For example, the controller 296 may open and close one or more of the valves 206, 232, 238, 248, 234, 240, 250, 252, 242, 270, 272, 290, 292, 294 and adjust the rate of flow of a gas through one or more of the mass flow controllers 274, 276, 282, 294, 296. As shown in FIG. 3, the controller 296 is communicatively coupled with the valves 206, 232, 238, 248, 234, 240, 250, 252, 242, 270, 272, 290, 292, 294 and the mass flow controllers 274, 276, 282, 294, 296 in one embodiment. The controller 296 may be embodied in a computing device, such as any one or more of an off-the-shelf PC with a single processor or multiple processors, with the functional operations distributed between the processors. Alternatively, the controller 296 may be implemented utilizing any combination of dedicated hardware boards, DSPs, processors, and the like. The controller 296 receives input 298 relating to the system 200 and communicates output signals as output 300, as described below. In one embodiment, the input 298 communicates a measurement of the system 200 and/or an instruction to the controller 296, while the output 300 communicates a direction to one or more components of the system 200 and is based on the input 298.

FIG. 3 is a schematic view of components and communication paths in the gas processing system 200 according to one embodiment. As shown in FIG. 3, the controller 296 is communicatively connected to each of the valves 206, 232, 238, 248, 234, 240, 250, 252, 242, 270, 272, 290, 292, 294 and the mass flow controllers 274, 276, 282, 294, 296 in one embodiment. The input 298 received by the controller 296 may be communicated from an input device (not shown) or one or more of the valves 206, 232, 238, 248, 234, 240, 250, 252, 242, 270, 272, 290, 292, 294 and the mass flow controllers 274, 276, 282, 294, 296 in one embodiment. For example, a user of the system 200 may enter the input 298 using an input device such as a keyboard, mouse, microphone, smart phone, and the like. As another example, one or more of the gas composition analyzers 256, 258, 260 may communicate the input 298 to the controller 296.

The controller 296 includes a processor 302 and a computer-readable storage medium 304. The functional blocks representative of the processor 302 and the storage medium 304 are not necessarily indicative of the division between hardware circuitry. Thus, for example, one or more of the functional blocks (for example, processors or memories) may be implemented in a single piece of hardware (for example, a general purpose signal processor or random access memory, hard disk, or the like). Similarly, the programs may be stand alone programs, may be incorporated as subroutines in an operating system, may be functions in an installed software package, and the like. It should be understood that the various embodiments are not limited to the arrangements and instrumentality shown in FIG. 3. The processor 302 may be embodied in one or more processors, dedicated hardware boards, DSPs, and the like. The computer-readable storage medium 304 may be embodied in one or more computer-readable memories, such as hard drives, ROM drives, RAM drives, flash drives, and the like.

Based on the input 298, the controller 296 determines the one or more directions or instructions and communicates the same to one or more of the valves 206, 232, 238, 248, 234, 240, 250, 252, 242, 270, 272, 290, 292, 294 and the mass flow controllers 274, 276, 282, 294, 296 as the output 300. For example, the controller 296 may receive the input 298 from a user that instructs the controller 296 to actuate the abatement valve 206 so that more or less effluent gas is diverted along the abatement flow path 208. In another example, the controller 296 may receive the input 298 from a user that indicates that the effluent gas in the reclamation reservoir 218 is contaminated. In response, the processor 302 generates a signal that is communicated to the appropriate components of the system 200. For example, the processor 302 may generate and communicate a signal as the output 298 that closes at least the valves 232, 234 and opens the valves 238, 248 so that the reclamation reservoir 218 may be flushed or purged of the contaminated effluent gas. The controller 296 may receive indications or relative amounts of the recycled deposition gas and the virgin gases that are to be introduced into the processing chamber 202. In response, the processor 302 may generate and communicate a signal as the output 298 to open and/or close one or more of the valves 280, 290, 292 to correspondingly adjust the relative amounts of the recycled deposition gas and the virgin gases that are introduced into the processing chamber 202. The controller 296 receives the input 298 and actuates one or more of the mass flow controllers 274, 276, 282, 294, 296 in one embodiment. For example, the controller 296 may receive the input 298 from a user that instructs the controller 296 to actuate one or more of the mass flow controllers 282, 294, 296. In response, the processor 302 generates and communicates a signal as the output 298 that adjusts one or more settings of the corresponding mass flow controllers 282, 294, 296 to adjust the relative amounts of the recycled deposition gas and the virgin gases that are introduced into the processing chamber 202.

In one embodiment, the system 200 operates in a closed loop manner to prevent the flow of contaminants into the processing chamber 202 and/or to control the concentration of one or more chemical species into the processing chamber 202. For example, the gas composition analyzers 256, 258, 260 may determine the concentrations of one or more contaminants and chemical species in the reservoirs 216. These concentrations are communicated to the controller 296 as the input 298. The processor 302 compares one or more of the concentrations to one or more predetermined thresholds stored on the computer-readable storage medium 304. If the concentrations exceed or fall below one or more thresholds, then the processor 302 generates one or more signals and communicates the signals as the output 300 to at least one of the valves 206, 232, 238, 248, 234, 240, 250, 252, 242, 270, 272, 290, 292, 294 and the mass flow controllers 274, 276, 282, 294, 296. The output 300 may direct one or more of the valves 206, 232, 238, 248, 234, 240, 250, 252, 242, 270, 272, 290, 292, 294 and the mass flow controllers 274, 276, 282, 294, 296 to open, close and/or otherwise adjust the rate of flow of an effluent and/or virgin gas so that the concentration of a contaminant is decreased, the concentration of a chemical species remains approximately the same, increases or decreases, and/or the flow of gas to and/or from a component of the system 200 is interrupted. The gas composition analyzers 256, 258, 260 may continue to monitor the concentrations of the contaminants and/or chemical species in the reservoirs 216 and to communicate these concentrations to the controller 296. The controller 296 may continue to change the flow of the recycled deposition and virgin gases flowing into the processing chamber 202 by controlling one or more of the valves 206, 232, 238, 248, 234, 240, 250, 252, 242, 270, 272, 290, 292, 294 and the mass flow controllers 274, 276, 282, 294, 296.

For example, based on a contaminant concentration level measured by a gas composition analyzer 256, 258, 260, the controller 296 may prevent the flow of contaminated effluent gas into one or more reclamation reservoirs 218, 220 and/or the mixing reservoir 222 by directing one or more valves upstream from the corresponding one of the reservoirs 216 to close. In another example, the controller 296 can increase or decrease the flow of virgin gas into the mixing reservoir 222 and/or the processing chamber 202 to increase or decrease the concentration of a chemical species based on the concentration of the chemical species in the mixing reservoir 222 and/or the processing chamber 202.

In one embodiment, the controller 296 directs one or more of the gas composition analyzers 256, 258, 260 to determine concentrations of contaminants and/or chemical species in the effluent and recycled deposition gases on the same or differing schedules. For example, the controller 296 may cause the gas composition analyzer 260 to determine the concentration of a chemical species in the recycled deposition gas in the mixing reservoir 222 multiple times during the deposition of a semiconductor layer in the processing chamber 202, while the gas composition analyzers 256, 258 determine concentrations of contaminants in the reclamation reservoirs 218, 220 a fewer number of times during this same time period. Alternatively, the gas composition analyzers 256, 258, 260 determine the contaminant and/or chemical species concentrations on approximately the same schedule.

Figure 4:
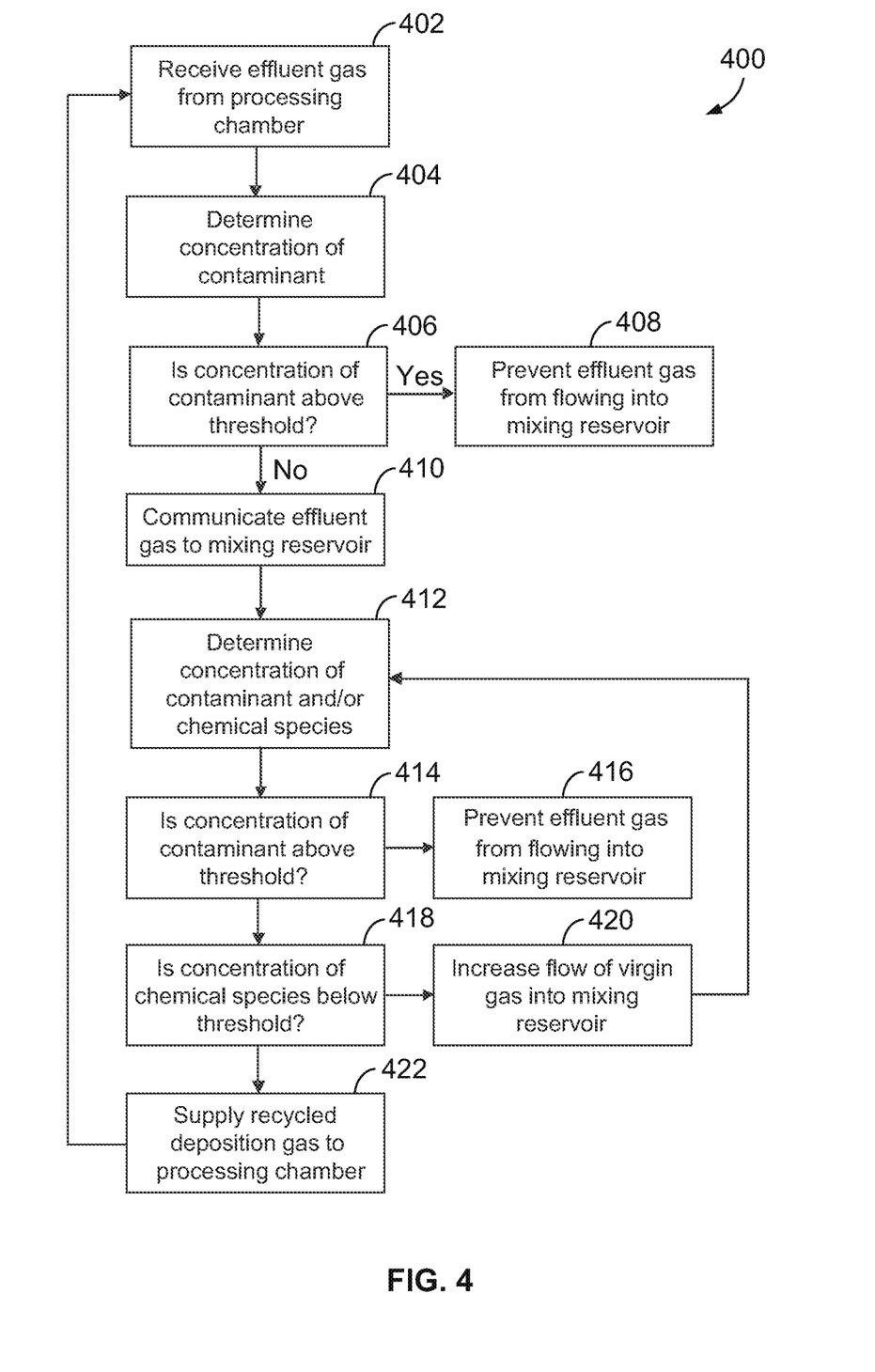
FIG. 4 is a flowchart of a method for recycling effluent gas in a processing system according to one embodiment.

FIG. 4 is a flowchart of a method 400 for recycling effluent gas in a processing system according to one embodiment. While the method 400 presents certain actions in one order, the method 400 is illustrated and described according to one embodiment. Variations of the actions and the order of the actions of the method 400 may be made, as well as the addition and removal of one or more actions, in one or more alternative embodiments. With respect to the method 400, effluent gas is received from a processing chamber at 402. For example, the effluent gas from the processing chamber 202 (shown in FIG. 2) may be received in at least one of the reclamation reservoirs 218, 220 (shown in FIG. 2). At 404, concentrations of one or more contaminants are determined. For example, the gas composition analyzers 256, 258 (shown in FIG. 2) may measure the concentration of a contaminant in the effluent gas held in the reclamation reservoirs 218, 220. At 406, a determination is made as to whether the purity of the effluent gas is sufficiently high. For example, a comparison is made between the measured contaminant concentration and a predetermined maximum contaminant concentration. If the contaminant concentration exceeds the maximum contaminant concentration, the method 400 proceeds between 406 and 408. At 408, the effluent gas is prevented from being communicated to a mixing reservoir. For example, one or more valves that are upstream from the mixing reservoir 222 may be closed to prevent contaminated effluent gas from flowing into the mixing reservoir 222.

On the other hand, if the contaminant concentration determined at 404 does not exceed the maximum contaminant concentration at 406, then the method 400 proceeds between 406 and 410. At 410, the effluent gas is communicated into the mixing reservoir. For example, the effluent gas in one or more of the reclamation reservoirs 218, 220 is communicated into the mixing reservoir 222. At 412, a concentration of one or more contaminants and/or chemical species in the effluent gas held in the mixing reservoir is determined. For example, the gas composition analyzer 260 (shown in FIG. 2) may measure the concentration of a contaminant and/or a chemical species in the mixing reservoir 222. At 414, a determination is made as to whether the purity of the effluent gas in the mixing reservoir is sufficiently high. For example, a comparison is made between the contaminant concentration measured in the mixing reservoir 222 and a predetermined maximum contaminant concentration. If the contaminant concentration exceeds the maximum contaminant concentration, the method 400 proceeds between 414 and 416. At 416, the effluent gas is prevented from being communicated from the mixing reservoir to the processing chamber as the recycled deposition gas. For example, one or more valves that are between the mixing reservoir 222 and the processing chamber 202 may be closed to prevent contaminated effluent gas from flowing from the mixing reservoir 222 and into the processing chamber 202. In one embodiment, the maximum contaminant concentrations, or thresholds, used at 406 and 414 are the same. Alternatively, the maximum contaminant concentrations used at 406 and 414 differ.

If the contaminant concentration determined at 412 does not exceed the maximum contaminant concentration at 414, then the method 400 proceeds between 414 and 418. At 418, a determination is made as to whether the effluent gas in the mixing reservoir has a sufficient composition to be communicated to the processing chamber. For example, a determination is made as to whether the concentration of one or more chemical species needed for depositing a semiconductor layer in the processing chamber exceeds a minimum threshold. The gas composition analyzer 260 may measure the concentration of a chemical species such as silane in the gas held in the mixing reservoir 222. If the concentration of the chemical species does not exceed the minimum threshold, the method 400 proceeds between 418 and 420. At 420, the flow of one or more virgin gases into the mixing reservoir is increased. For example, virgin silane and/or hydrogen gas may be communicated into the mixing reservoir 222 to increase the concentration of the silane and/or hydrogen in the gas held in the mixing reservoir 222. The method 400 proceeds between 420 and 412, where the concentration of one or more contaminants and/or chemical species is again determined, as described above. For example, the method 400 proceeds in a loop whereby the concentration of contaminants and chemical species in the gas held by the mixing reservoir is determined and the concentration of the chemical species is increased until the concentration of the chemical species exceeds a threshold.

If it is determined at 418 that the concentration of the chemical species exceeds the minimum threshold, the method 400 proceeds between 418 and 422. At 422, the gas held in the mixing reservoir is supplied to the processing chamber. For example, the recycled deposition gas held in the mixing reservoir 222 may be communicated to the processing chamber 202 for use in depositing a semiconductor layer. The method 400 proceeds between 422 and 402. For example, the method 400 proceeds in a loop whereby at least some of the effluent gas from depositing one semiconductor layer is recycled and re-used to deposit more of the same semiconductor layer, or another semiconductor layer.

One or more embodiments described herein provide systems and methods for recycling at least a portion of the gas left unused in depositing a semiconductor layer. The systems and methods may provide for a closed loop system whereby the composition and purity of the effluent gas is monitored and the effluent gas is prevented from reaching the mixing reservoir and/or processing chamber when the contaminant concentration is too high. The concentration of a chemical species that is consumed during deposition of the semiconductor layer may be monitored and the concentration of the chemical species may be increased by flowing virgin gas into the mixing reservoir and/or the processing chamber. The systems and methods may be fully or partially automated. In one embodiment, the effluent gas may be measured for contaminant and/or chemical species concentrations and reconstituted as a recycled deposition gas concurrently with the deposition of a semiconductor layer in the processing chamber.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and merely are example embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A system for recycling, the system comprising:
   a processing chamber receiving at least a portion of a deposition gas used to deposit a first semiconductor layer, the processing chamber having an exhaust that discharges an unused portion of the deposition gas from the processing chamber and into a first flow path as an effluent gas;
   a plurality of reclamation reservoirs in fluid communication with the processing chamber by the first flow path, the reclamation reservoirs fluidly coupled with each other in a series by the first flow path, the reclamation reservoirs receiving and storing the effluent gas that is exhausted from the processing chamber;
   a mixing reservoir in fluid communication with the series of reclamation reservoirs and the processing chamber, the mixing reservoir mixing the effluent gas that is received from the series of reclamation reservoirs with a virgin gas to form a recycled deposition gas, the mixing reservoir also supplying the recycled deposition gas to the processing chamber to deposit at least one of an additional portion of the first semiconductor layer or a second semiconductor layer in the processing chamber;

first valves fluidly coupling the reclamation reservoirs with the first flow path, each of the first valves disposed upstream of a respective one of the reclamation reservoirs along the first flow path when the first valves are open, at least one of the first valves is disposed upstream of the series of reclamation reservoirs and remaining ones of the first valves disposed between adjacent pairs of the reclamation reservoirs in the series; and second valves fluidly coupling the reclamation reservoirs with a bypass flow path that is different from the first flow path, each of the second valves disposed between the bypass flow path and a respective one of the reclamation reservoirs, the second valves being disposed upstream of the respective ones of the reclamation reservoirs when the second valves are open, wherein each of the first valves is configured to disconnect the respective reclamation reservoir from the first flow path and each of the second valves is configured to connect the respective reclamation reservoir from the bypass flow path such that the reclamation reservoir that is disconnected from the first and bypass flow paths can be removed while the effluent gas continues to flow into the reclamation reservoirs that remain connected to the first and bypass flow paths via the first and bypass flow paths.

2. The system of claim 1, wherein the series of reclamation reservoirs is configured to store the effluent gas from the deposition of the first semiconductor layer and to convey the effluent gas to the mixing reservoir when a purity of the effluent gas exceeds a designated purity threshold.

3. The system of claim 1, further comprising a gas composition analyzer configured to be operatively coupled with the series of reclamation reservoir, the gas composition analyzer for measuring a concentration of a contaminant in the effluent gas in the series of reclamation reservoirs, wherein the series of reclamation reservoirs is configured to convey the effluent gas to the mixing reservoir only when the concentration of the contaminant is less than a predetermined contaminant threshold.

4. The system of claim 1, further comprising a gas composition analyzer configured to be operatively coupled with the mixing reservoir, the gas composition analyzer configured to measure a concentration of a contaminant in the recycled deposition gas in the mixing reservoir, wherein the mixing reservoir is configured to convey the recycled deposition gas with the concentration of the contaminant being less than a predetermined contaminant threshold to the processing chamber when.

5. The system of claim 1, further comprising a gas composition analyzer configured to be operatively coupled with the mixing reservoir, the gas composition analyzer configured to measure a concentration of a chemical species in the recycled deposition gas in the mixing reservoir, the chemical species being at least partially consumed in the deposition of the at least one of the additional portion of the first semiconductor layer or the second semiconductor layer, wherein the mixing reservoir is configured to convey the recycled deposition gas having the concentration of the chemical species in excess of a predetermined chemical species threshold to the processing chamber.

6. The system of claim 1, further comprising a gas source reservoir configured to be in fluid communication with the mixing reservoir, the gas source reservoir configured to supply the virgin gas to the mixing reservoir in order to increase a concentration of a chemical species in the recycled deposition gas, the chemical species being at least partially consumed in the deposition of the at least one of the additional portion of the first semiconductor layer or the second semiconductor layer.

7. The system of claim 1, wherein the series of reclamation reservoirs is configured to store the effluent gas at a pressure above atmospheric pressure.

8. The system of claim 1, wherein one or more of the reclamation reservoirs that are disconnected from the first and second flow paths by the respective first valve and the respective second valve is configured to be removed from fluid communication with the processing chamber and the mixing reservoir and replaced with a replacement reclamation reservoir, the replacement reclamation reservoir connected with the respective first valve and the respective second valve that were coupled with the reclamation reservoir that was removed in order to fluidly couple the replacement reclamation reservoir with the first and second flow paths.

9. The system of claim 1, further comprising a pressurizing pump configured to be fluidly coupled between the process chamber and at least one of the series of reclamation reservoirs or the mixing reservoir, the pressurizing pump configured to draw the effluent gas from the processing chamber at a sub-atmospheric pressure and exhaust the effluent gas at an above-atmospheric pressure into the at least one of the series of reclamation reservoirs or the mixing reservoir.

10. The system of claim 1, wherein the series of reclamation reservoirs have sufficient storage capacity that the series of reclamation reservoirs is configured to collect and store the effluent gas from deposition of the first semiconductor layer until the deposition of the first semiconductor layer is complete.

11. The system of claim 10, wherein the reclamation reservoirs convey the effluent gas having a purity that exceeds a designated threshold to the mixing reservoir.

12. A system for recycling gas used to deposit a first semiconductor layer in a processing chamber, the system comprising:

a plurality of reclamation reservoirs fluidly coupled with each other in series and by a first flow path, the reclamation reservoirs configured to receive effluent gas exhausted from the processing chamber and to store the effluent gas exhausted from the processing chamber during deposition of the first semiconductor layer;

first valves fluidly coupling the reclamation reservoirs with the first flow path, each of the first valves disposed upstream of a respective one of the reclamation reservoirs along the first flow path when the first valves are open, at least one of the first valves is disposed upstream of the series of reclamation reservoirs and remaining ones of the first valves disposed between adjacent pairs of the reclamation reservoirs in the series;

second valves fluidly coupling the reclamation reservoirs with a bypass flow path, each of the second valves disposed between the bypass flow path and a respective one of the reclamation reservoirs, the second valves being disposed upstream of the respective ones of the reclamation reservoirs when the second valves are open, wherein each of the first valves is configured to disconnect the respective reclamation reservoir from the first flow path and each of the second valves is configured to connect the respective reclamation reservoir from the bypass flow path such that the reclamation reservoir that is disconnected from the first and bypass flow paths can be removed while the effluent gas continues to flow into the reclamation reservoirs that remain connected to the first and bypass flow paths via the first and bypass flow paths;

a gas composition analyzer configured to determine at least one of a composition or a purity of the effluent gas in at least one of the reclamation reservoirs; and a mixing reservoir configured to receive the effluent gas from the reclamation reservoirs when the at least one of the composition or the purity of the effluent gas exceeds a designated threshold, wherein the mixing reservoir is configured to mix the effluent gas with a virgin gas to create a recycled deposition gas and to convey the recycled deposition gas to the processing chamber to deposit at least one of an additional portion of the first semiconductor layer or a second semiconductor layer.

13. The system of claim 12, wherein a first reclamation reservoir in the plurality of reclamation reservoirs is configured to convey the effluent gas to at least one of a second reclamation reservoir in the plurality of reclamation reservoirs or the mixing reservoir when the purity of the effluent gas in the first reclamation reservoir exceeds a predetermined threshold.

14. The system of claim 12, wherein a first reclamation reservoir in the plurality of reclamation reservoirs is configured to convey the effluent gas to at least one of a second reclamation reservoir in the plurality of reclamation reservoirs or the mixing reservoir.

15. The system of claim 12, wherein the reclamation reservoirs are configured to receive and store the effluent gas from deposition of the first semiconductor layer, and to communicate the effluent gas to the mixing reservoir.

16. The system of claim 12, further comprising a pump configured to be fluidly coupled with the processing chamber between the processing chamber and the reclamation reservoirs, the pump configured to draw the effluent gas from the processing chamber at a sub-atmospheric pressure and to pump the effluent gas into the reclamation reservoirs at a pressure above atmospheric pressure.

17. The system of claim 12, further comprising a gas source reservoir and a third valve, the gas source reservoir configured to convey the virgin gas to the mixing reservoir and to the processing chamber, the third valve configured to prevent the recycled deposition gas from flowing into the processing chamber and to permit the virgin gas to flow into the processing chamber from the gas source reservoir based on the purity of the effluent gas in at least one of the reclamation reservoirs being below a predetermined threshold.

18. The system of claim 12, wherein the first semiconductor layer comprises intrinsic silicon.

\* \* \* \* \*